(12) United States Patent
Marques Martins et al.

(10) Patent No.: US 9,488,674 B2
(45) Date of Patent: Nov. 8, 2016

(54) TESTING DEVICE AND A CIRCUIT ARRANGEMENT

(71) Applicant: Infineon Technologies AG, Neubiberg (DE)

(72) Inventors: Carlos Marques Martins, Munich (DE); Steffen Thiele, Munich (DE); Aron Theil, Neufahrn (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 135 days.

(21) Appl. No.: 14/326,483

(22) Filed: Jul. 9, 2014

(65) Prior Publication Data

US 2016/0011232 A1    Jan. 14, 2016

(51) Int. Cl.
*G01R 1/04*    (2006.01)

(52) U.S. Cl.
CPC .................. *G01R 1/0416* (2013.01)

(58) Field of Classification Search
CPC ............. G01R 31/31922; G01R 31/3191; G01R 31/31926; G01R 31/31921; G01R 31/2834; G01R 31/31813
USPC .............. 324/762.01, 754.03, 537, 762.02, 324/762.03
See application file for complete search history.

(56) References Cited

U.S. PATENT DOCUMENTS

| | | |
|---|---|---|
| 4,354,268 A | 10/1982 | Michel et al. |
| 4,928,278 A | 5/1990 | Otsuji et al. |
| 5,025,205 A | 6/1991 | Mydill et al. |
| 5,153,883 A | 10/1992 | Hayashi et al. |
| 5,212,443 A | 5/1993 | West et al. |
| 5,499,248 A | 3/1996 | Behrens et al. |
| 2010/0090675 A1* | 4/2010 | Dono ............... G01R 31/31723 323/317 |
| 2013/0231886 A1* | 9/2013 | Yaguchi ................ G06F 11/273 702/119 |

FOREIGN PATENT DOCUMENTS

WO    9632678 A1    10/1996

* cited by examiner

*Primary Examiner* — Vincent Q Nguyen

(57) ABSTRACT

A testing device in accordance with various embodiments may include: a plurality of first terminals configured to be connected to a plurality of devices-under-test, wherein each first terminal of the plurality of first terminals may be configured to be connected to a respective device-under-test of the plurality of devices-under-test; a signal interface configured to be connected to a tester; and a circuit configured to exchange an identical first signal with each device-under-test of the plurality of devices-under-test through a respective first terminal of the plurality of first terminals, and to exchange at least one interface signal with the tester through the signal interface.

20 Claims, 9 Drawing Sheets

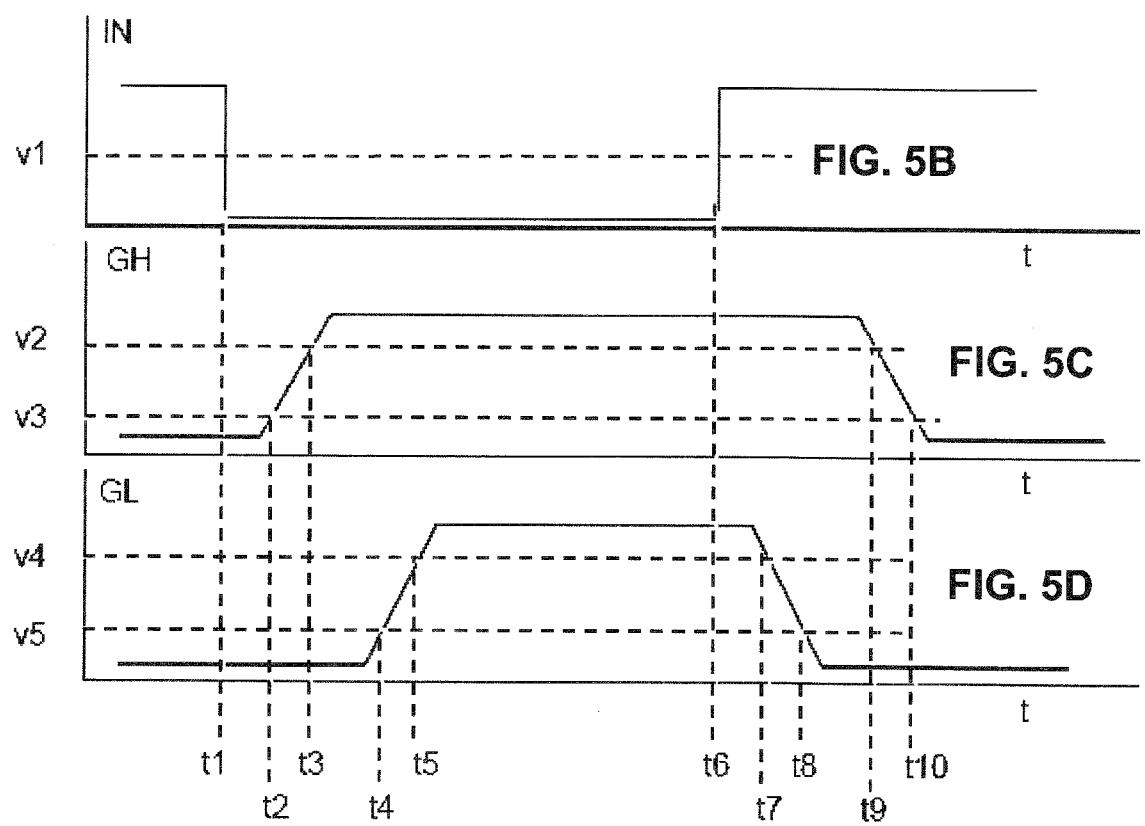

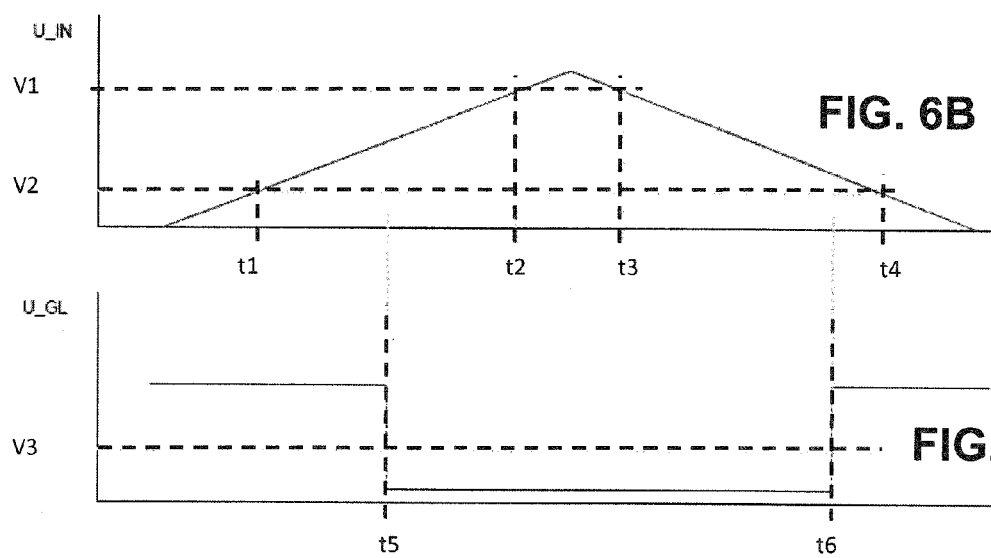

TESTING DEVICE AND A CIRCUIT ARRANGEMENT

TECHNICAL FIELD

Various embodiments relate to a testing device and a circuit arrangement.

BACKGROUND

The number of devices-under-test (DUTs) that may be tested in parallel may depend on the hardware of the test equipment (e.g. a tester). It may be desirable to increase the number of DUTs that may be tested in parallel, which may, for example, decrease test time and/or test cost.

SUMMARY

A testing device in accordance with various embodiments may include: a plurality of first terminals configured to be connected to a plurality of devices-under-test (DUTs), wherein each first terminal of the plurality of first terminals may be configured to be connected to a respective DUT of the plurality of DUTs; a signal interface configured to be connected to a tester; and a circuit configured to exchange an identical first signal with each DUT of the plurality of DUTs through a respective first terminal of the plurality of first terminals, and to exchange at least one interface signal with the tester through the signal interface.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5A to FIG. 5D shows a circuit arrangement and various curves for testing various timings of each DUT of a plurality of DUTs according to various embodiments.

FIG. 6A to FIG. 6C shows a circuit arrangement and various curves for testing various timings of each DUT of a plurality of DUTs according to various embodiments.

DESCRIPTION

Figure 1:
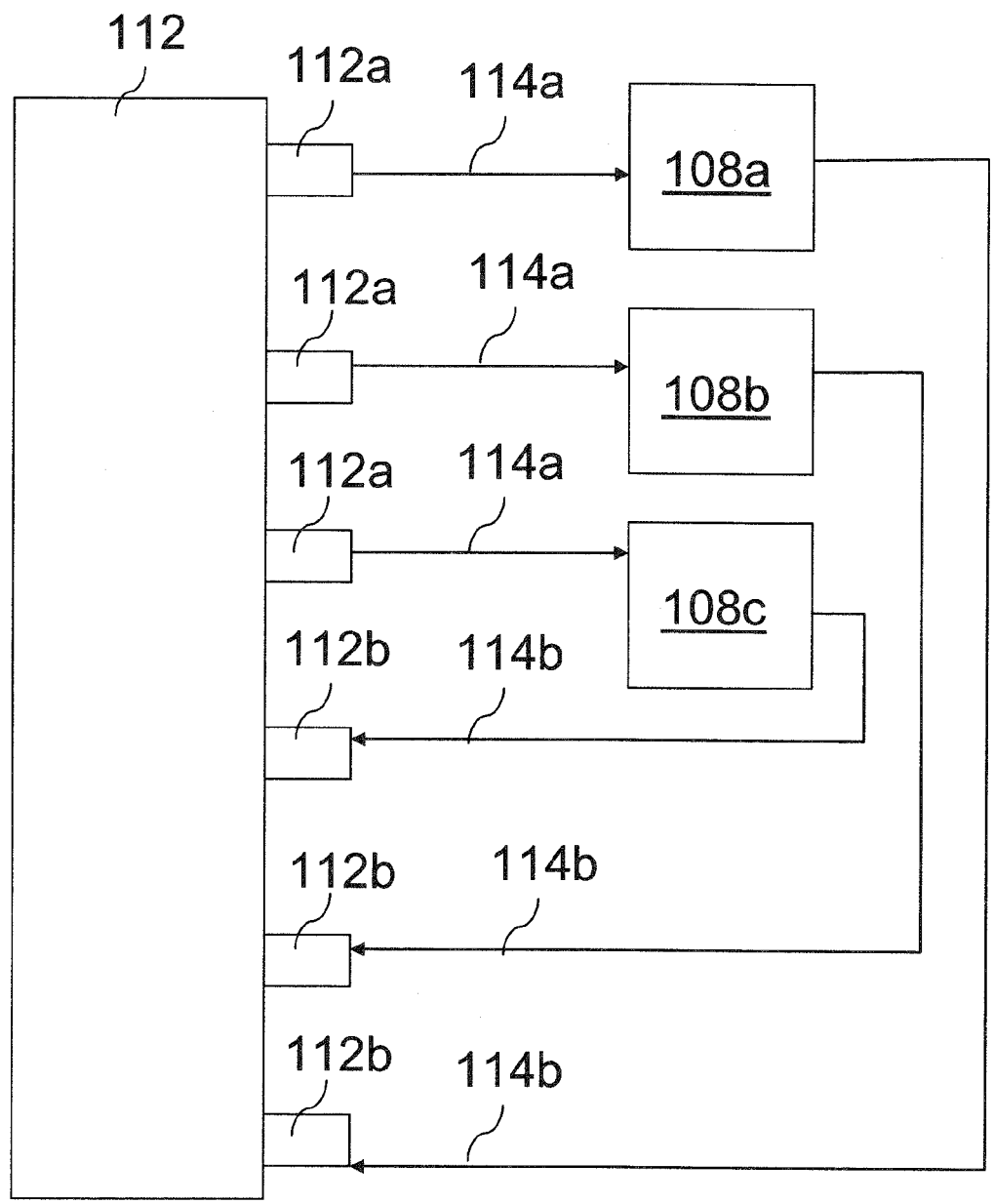
FIG. 1 shows a block diagram including a tester and a plurality of DUTs in which parallel testing may be performed.

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described for structures or devices, and various embodiments are described for methods. It may be understood that one or more (e.g. all) embodiments described in connection with structures or devices may be equally applicable to the methods, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "coupled" and/or "electrically coupled" and/or "connected" and/or "electrically connected", used herein to describe a feature being connected to at least one other implied feature, are not meant to mean that the feature and the at least one other implied feature must be directly coupled or connected together; intervening features may be provided between the feature and at least one other implied feature.

Directional terminology, such as e.g. "upper", "lower", "top", "bottom", "left-hand", "right-hand", etc., may be used with reference to the orientation of figure(s) being described. Because components of the figure(s) may be positioned in a number of different orientations, the directional terminology is used for purposes of illustration and is in no way limiting. It is to be understood that structural or logical changes may be made without departing from the scope of the invention.

Circuit testers may be provided to test the functionality of chips (or dies) and/or components prior to the insertion or installation of the chips (or dies) and/or components in an assembly, such as, for example, soldering on a printed circuit board. If any malfunction of a chip (or die) and/or component were only detectable on the board level (e.g. by a board tester), there may be a need to discard and/or reject the complete board, or at least the need for costly measures would arise, such as, for example, removal of the defective chip and/or component. Thus, testers may ensure that defective chips and/or components are detected in an early stage of assembly. This aspect may become more important with increasing integration, e.g., increasing package density of chips and/or components. Chips and/or components that are individually tested may be referred to as devices-under-test (DUTs).

Parallel testing, namely, testing more than one chip and/or component simultaneously may be a factor in order to save test time and/or test costs. To achieve this, each DUT to be tested may be connected with separate sources of the tester, and the required number of components may be provided to the tester hardware.

FIG. 1 shows a block diagram including a tester 112 and a plurality of DUTs 108a, 108b, 108c, in which parallel testing may be performed.

As shown in FIG. 1, the plurality of DUTs 108a, 108b, 108c may be connected to the tester 112. The tester 112 may include a plurality of test pins 112a, 112b. At least one test pin of the plurality of test pins 112a, 112b may be configured to provide a test signal 114a for testing the plurality of DUTs 108a, 108b, 108c. For example, test pins 112a may be configured as output pins of the tester 112, and may provide the test signal 114a to each DUT of the plurality of DUTs 108a, 108b, 108c. At least one test pin of the plurality of test pins 112a, 112b may be configured to receive a test response signal 114b from each DUT of the plurality of DUTs 108a, 108b, 108c. For example, test pins 112b may be configured as input pins of the tester 112, and may receive the test response signal 114b from each DUT of the plurality of DUTs 108a, 108b, 108c.

It may be seen in FIG. 1 that the number of DUTs 108a, 108b, 108c which may be tested in parallel may be limited by the resources of the tester 112 (e.g. the number of test pins 112a of the tester 112 that are configured to provide the test signal 114a and/or the number of test pins 112b of the tester 112 that are configured to receive the test response signal 114b and/or the number of test signal sources in the tester 112). In other words, the number of DUTs 108a, 108b, 108c that may be tested in parallel may depend on the number of sources and/or measurement channels (e.g test pins) included in the tester 112. In addition, the number of DUTs 108a, 108b, 108c that may be tested in parallel may depend on the space available on the hardware of the tester 112. Accordingly, it may be desirable to remove the dependency of the number of DUTs 108a, 108b, 108c that may be tested in parallel on the resources of the tester 112. In other words, it may be desirable to increase the number of DUTs which may be tested in parallel, without having to redesign the tester 112.

Figure 2:
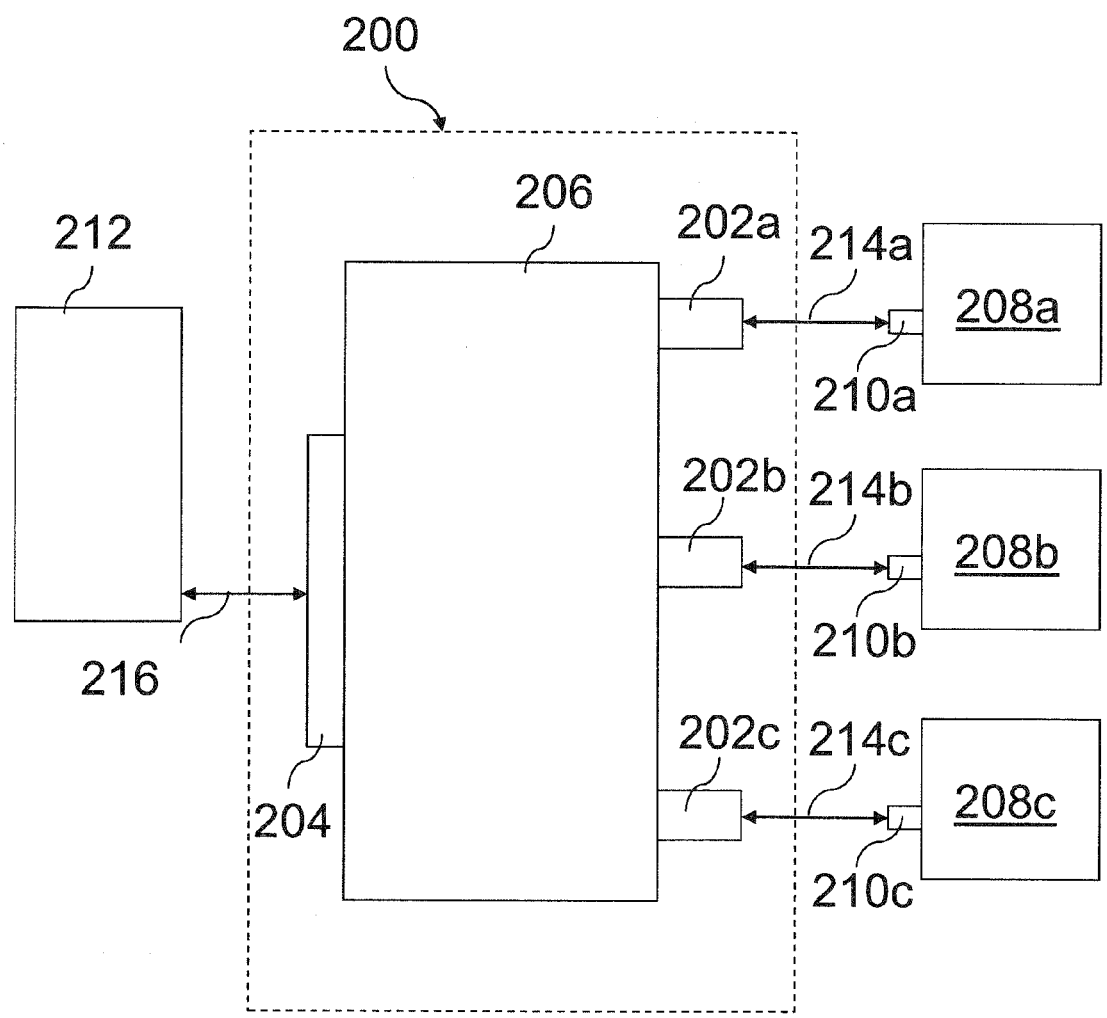
FIG. 2 shows a block diagram of a testing device according to various embodiments.

FIG. 2 shows a block diagram of a testing device 200 according to various embodiments.

The testing device 200 shown in FIG. 2 may be used to increase the number of DUTs which may be tested in parallel. Stated in another way, the testing device 200 may increase the number of DUTs that may be tested in parallel. For example, using the testing device 200, the number of DUTs which may be tested in parallel may be greater than or equal to about 2, e.g. greater than or equal to about 5, e.g. greater than or equal to about 10, e.g. greater than or equal to about 30, e.g. greater than or equal to about 50, e.g. greater than or equal to about 100, e.g. greater than or equal to about 200, e.g. greater than or equal to about 500, e.g. greater than or equal to about 800, e.g. greater than or equal to about 1000, e.g. greater than or equal to about 1500, e.g. greater than or equal to about 2000, although other numbers may be possible as well in accordance with other embodiments. The manner in which the testing device 200 may increase the number of DUTs which may be tested in parallel is described below.

The testing device 200 may include a plurality of first terminals 202a, 202b, 202c; a signal interface 204; and circuit 206.

The word "circuit" is used herein to mean any kind of a logic implementing entity, which may be special purpose circuit or processor executing software stored in a memory, firmware, or any combination thereof. Thus, in one or more examples, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Different circuits can thus also be implemented by the same component, e.g. by a processor executing two different programs.

Only three first terminals 202a, 202b, 202c are shown as an example, however the number of first terminals 202a, 202b, 202c may be greater than three, and may, for example, be four, five, six, seven, eight, nine, or on the order of tens, hundreds, thousands of, or even more first terminals 202a, 202b, 202c in some embodiments.

In one or more embodiments, the plurality of first terminals 202a, 202b, 202c may be configured to be connected to a plurality of DUTs 208a, 208b, 208c. Only three DUTs 208a, 208b, 208c are shown as an example, however the number of DUTs may be greater than three, and may, for example, be four, five, six, seven, eight, nine, or on the order of tens, hundreds, thousands of, or even more DUTs in some embodiments.

In one or more embodiments, each first terminal of the plurality of first terminals 202a, 202b, 202c may be configured to be connected to a respective DUT of the plurality of DUTs 208a, 208b, 208c. For example, as shown in FIG. 2, the first terminal 202a may be configured to be connected to the DUT 208a; the first terminal 202b may be configured to be connected to the DUT 208b; and the first terminal 202c may be configured to be connected to the DUT 208c. Stated differently, a respective first terminal of the plurality of first terminals 202a, 202b, 202c may be configured to be connected to a respective DUT of the plurality of DUTs 208a, 208b, 208c. In one or more embodiments, each first terminal of the plurality of first terminals 202a, 202b, 202c may be configured to be connected to a different DUT of the plurality of DUTs 208a, 208b, 208c.

In one or more embodiments, the respective first terminal may be configured to be connected to a respective pin of the respective DUT. For example, as shown in FIG. 2, the respective first terminal 202a may be configured to be connected to a respective pin 210a of the respective DUT 208a. In like manner, the respective first terminal 202b may be configured to be connected to a respective pin 210b of the respective DUT 208b; and the respective first terminal 202c may be configured to be connected to a respective pin 210c of the respective DUT 208c.

In one or more embodiments, the respective pins 210a, 210b, 210c of the respective DUTs 208a, 208b, 208c may be configured to provide the same (technical) function (e.g. for an identical technical use) in each respective DUT 208a, 208b, 208c. In other words, the respective pins 210a, 210b, 210c may fulfill an identical function in the respective DUTs 208a, 208b, 208c. For example, the respective pins 210a, 210b, 210c may each be configured as a non-inverting signal input for the respective DUTs 208a, 208b, 208c. By way of another example, the respective pins 210a, 210b, 210c may each be configured as a power supply input for the respective DUTs 208a, 208b, 208c. By way of yet another example, the respective pins 210a, 210b, and 210c may each be configured as a signal output for the respective DUTs 208a, 208b, 208c. In one or more embodiments, the respective DUTs 208a, 208b, 208c may be identical to each other. Accordingly, the respective pins 210a, 210b, 210c may have labelled with the same name in each of the respective DUTs 208a, 208b, 208c. For example, each of the respective pins 210a, 210b, 210c may be labelled as an "IN" pin in each of the respective DUTs 208a, 208b, 208c (for example, shown in FIG. 5 and FIG. 6).

Testing the plurality of DUTs 208a, 208b, 208c may include providing at least one signal to and/or receiving at least one signal from each DUT of the plurality of DUTs 208a, 208b, 208c. In other words, testing the plurality of DUTs 208a, 208b, 208c may include the testing device 200 exchanging a signal with (e.g. providing a signal to and/or receiving a signal from) the plurality of DUTs 208a, 208b, 208c through the plurality of first terminals 202a, 202b, 202c.

In one or more embodiments, the circuit 206 of the testing device 200 may be configured to exchange an identical first signal 214a, 214b, 214c with each DUT of the plurality of DUTs 208a, 208b, 208c. It is to be noted that the term "exchange" include, for example, a transmitting/receiving of a respective signal as well as e.g. a forcing, measuring or monitoring of a respective signal. The identical first signal 214a, 214b, 214c may be exchanged with each DUT of the plurality of DUTs 208a, 208b, 208c via (in other words through) the respective first terminal. For example, as shown in FIG. 2, the circuit 206 may exchange the first signal 214a with the DUT 208a via (in other words through) the respective first terminal 202a. In like manner, the circuit 206 may exchange the first signal 214b (which may be identical to the first signal 214a) with the DUT 208b through the respective first terminal 202b; and the circuit 206 may exchange the first signal 214c (which may be identical to the first signal 214a) with the DUT 208c through the respective first terminal 202c. Therefore, in contrast to FIG. 1 in which the tester 112 exchanges different types of signals (e.g. a test signal 114a and a response signal 114b) with the plurality of DUTs, the circuit 206 of the testing device 200 exchanges an identical signal with each DUT of the plurality of DUTs 208a, 208b, 208c.

In one or more embodiments, the signal interface 204 of the testing device 200 may be configured to be connected to a tester 212. In one or more embodiments, the circuit 206 may be configured to exchange at least one interface signal 216 with the tester 212 through the signal interface 204. In one or more embodiments, the at least one interface signal 216 may in addition be provided to an additional logic circuit, e.g. one or more programmable logic circuits (such as e.g. one or more processores, e.g. one or more Personal Computers (PC), or one or more Application Specific Integrated Circuits (ASICs), or one or more Field Programmable Gate Arrays (FPGAs). In one or more embodiments, the identical first signal 214a, 214b, 214c exchanged with each DUT of the plurality of DUTs 208a, 208b, 208c may depend on the at least one interface signal 216 exchanged with the tester 212 through the signal interface 204. For example, the identical first signal 214a, 214b, 214c exchanged with each DUT of the plurality of DUTs 208a, 208b, 208c may be a replication of the at least one interface signal 216. In one or more embodiments, the converse may be true, namely, the at least one interface signal 216 exchanged with the tester 212 through the signal interface 204 may depend on the identical first signal 214a, 214b, 214c exchanged with each DUT of the plurality of DUTs 208a, 208b, 208c. For example, the at least one interface signal 216 may contain information about the identical first signal 214a, 214b, 214c.

The tester 212 may include, or may be, an integrated circuit (IC) test system. The tester 212 may be configured to provide at least one signal to and/or receive at least one signal from one or more devices external to the tester 212 (e.g. the testing device 200 and/or the plurality of DUTs 208a, 208b, 208c). In other words, the tester 212 may exchange at least one signal (e.g. the at least one interface signal 216) with one or more devices external to the tester 212 (e.g. the testing device 200 and/or the plurality of DUTs 208a, 208b, 208c). The tester 212 may include hardware and/or software that may be capable of generating the at least one signal (e.g. the at least one interface signal 216) exchanged with the one or more devices external to the tester 212.

The tester 212 may be capable of analyzing a response signal from one or more devices external to the tester 212. The response signal may be a response by the one or more devices external to the tester 212 to at least one signal exchanged with these one or more devices external to the tester 212. For example, the tester 212 may be capable of analyzing a response signal from the plurality of DUTs 208a, 208b, 208c, wherein the response signal may be a response by the plurality of DUTs 208a, 208b, 208c to the identical first signal 214a, 214b, 214c provided to the plurality of DUTs 208a, 208b, 208c by, for example, the testing device 200. Accordingly, at least one signal may be exchanged between the tester 212 and the plurality of DUTs 208a, 208b, 208c via the testing device 200. In other words, the testing device 200 may mediate an exchange of signals and/or data between the tester 212 and the plurality of DUTs 208a, 208b, 208c. Accordingly, the testing device 200 may be configured to send at least one signal (e.g. the at least one interface signal 216) to and/or receive at least one signal (e.g. the at least one interface signal 216) from the tester 212. Similarly, the testing device 200 may be configured to send at least one signal (e.g. the identical first signal 214a, 214b, 214c) to and/or receive at least one signal (e.g. the identical first signal 214a, 214b, 214c) from the plurality of DUTs 208a, 208b, 208c. The identical first signal 214a, 214b, 214c exchanged between the testing device 200 and the plurality of DUTs 208a, 208b, 208c may, for example, be controlled by the tester 212 (e.g. by means of a controller, which may be included in the tester 212).

As seen in FIG. 2, an aspect of the testing device 200 may be that the degree of parallelism no longer depends on the number of the sources and measuring channels provided by the tester 212, and may, instead, depend on the testing device 200. The testing device 200 may be implemented by means of an integrated chip (IC). One IC may also include a plurality of testing units 200.

Figure 3:
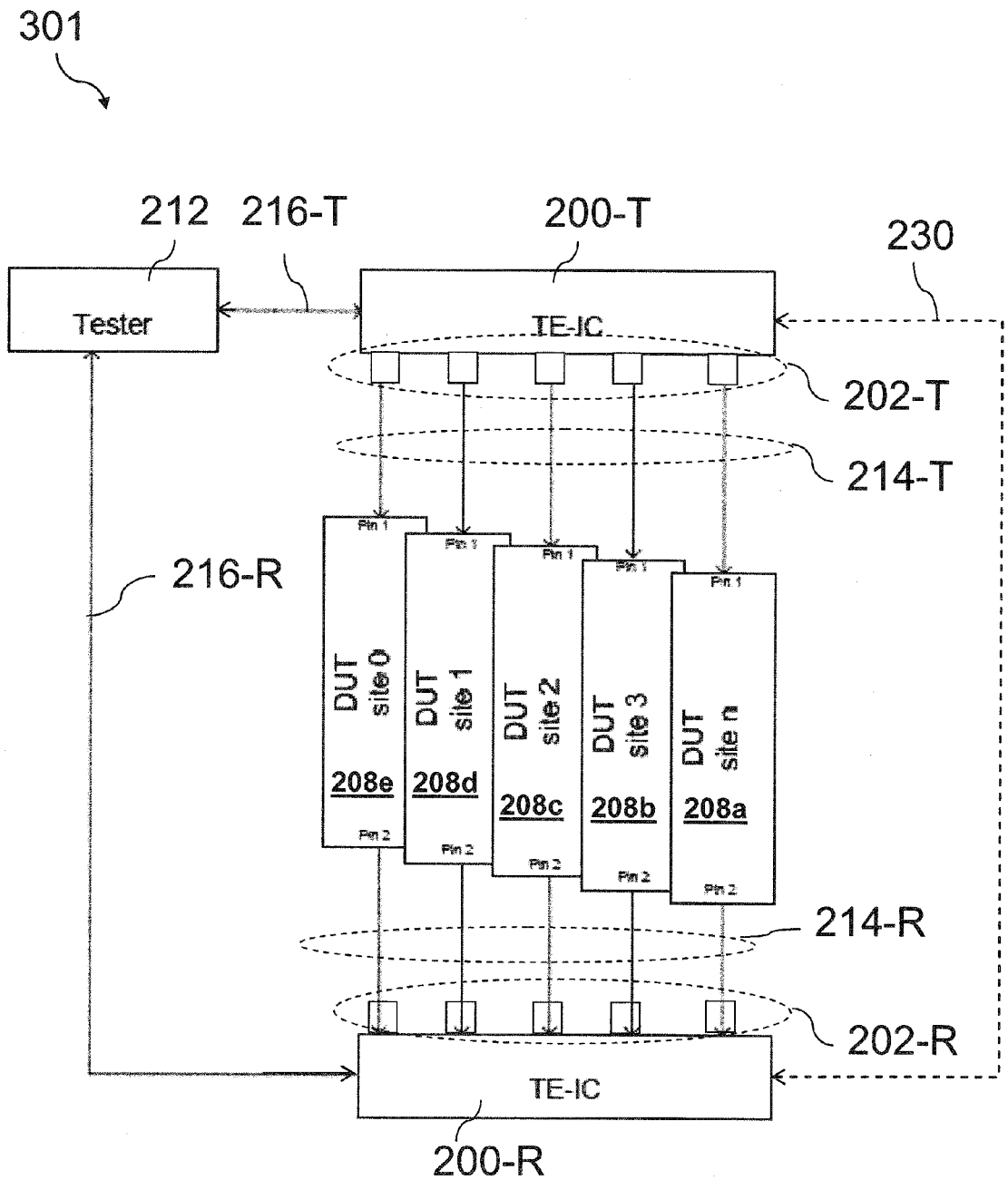
FIG. 3 shows a block diagram of a circuit arrangement according to various embodiments.

FIG. 3 shows a block diagram of a circuit arrangement 301 according to various embodiments.

Reference signs in FIG. 3 that are the same as in FIG. 2 denote the same or similar elements as in FIG. 2. Thus, those elements will not be described in detail again here; reference is made to the description above. Differences between FIG. 3 and FIG. 2 are described below.

In one or more embodiments, the circuit arrangement 301 may include a plurality of testing devices 200-T, 200-R; a plurality of DUTs 208a, 208b, 208c, 208d, 208e; and a tester 212.

Only two testing devices 200-T, 200-R are shown as an example, however the number of testing devices may be greater than two, and may, for example, be three, four, five, six, seven, eight, nine, or on the order of tens, hundreds, thousands of, or even more testing devices in some embodiments.

In like manner, only five DUTs 208a, 208b, 208c, 208d, 208e are shown as an example, however the number of DUTs may be less than five (e.g. two, three, four) or may be greater than five, and may, for example, be six, seven, eight, nine, or on the order of tens, hundreds, thousands of, or even more DUTs in some embodiments.

In one or more embodiments, at least one testing device of the plurality of testing devices 200-T, 200-R may be used to provide an identical first signal to the plurality of DUTs 208a, 208b, 208c, 208d, 208e. For example, in FIG. 3, the testing device 200-T may be used to provide an identical first signal 214-T to the plurality of DUTs 208a, 208b, 208c, 208d, 208e. The identical first signal 214-T may be provided to each DUT of the plurality of DUTs 208a, 208b, 208c, 208d, 208e through a plurality of first terminals 202-T. Each first terminal of the plurality of first terminals 202-T may be connected to a respective DUT of the plurality of DUTs 208a, 208b, 208c, 208d, 208e, as shown in FIG. 3.

In one or more embodiments, at least one testing device of the plurality of testing devices 200-T, 200-R, may be used to receive an identical first signal from the plurality of DUTs 208a, 208b, 208c, 208d, 208e. For example, in FIG. 3, the testing device 200-R may be used to receive an identical first signal 214-R from the plurality of DUTs 208a, 208b, 208c, 208d, 208e. The identical first signal 214-R may be received from each DUT of the plurality of DUTs 208a, 208b, 208c, 208d, 208e through a plurality of first terminals 202-R. Each first terminal of the plurality of first terminals 202-R may be connected to a respective DUT of the plurality of DUTs 208a, 208b, 208c, 208d, 208e, as shown in FIG. 3.

In one or more embodiments, the plurality of testing devices 200-T, 200-R may be configured to exchange at least one interface signal 216-T, 216-R with the tester 212. For example, the testing device 200-T may be configured to exchange the at least one interface signal 216-T with the tester 212 through the signal interface of the testing device 200-T. In like manner, the testing device 200-R may be configured to exchange the at least one interface signal 216-R with the tester 212 through the signal interface of the testing device 200-R. In one or more embodiments, a testing device of the plurality of testing devices 200-T, 200-R may be coupled (e.g. communicatively and/or electrically coupled) to at least one other testing device of the plurality of testing devices 200-T, 200-R. In one or more embodiments, the plurality of testing devices 200-T, 200-R may, for example, be connected together in sequence or in a ring (e.g. in a daisy chain). For instance, in the example shown in FIG. 3, the testing devices 200-T and 200-R may be coupled (e.g. communicatively and/or electrically coupled) to each other by means of a connection 230. The connection 230 may include, or may be, a serial communications connection, e.g. a serial peripheral interface (SPI) communications connection, although other communications connections may be possible as well.

The circuit arrangement 301 shown in FIG. 3 may be used to test the plurality of DUTs 208a, 208b, 208c, 208d, 208e. For example, the testing device 200-T may be used to provide identical test signals to each DUT of the plurality of DUTs 208a, 208b, 208c, 208d, 208e, whilst the testing device 200-R may be used to receive test response signals from each DUT of the plurality of DUTs 208a, 208b, 208c, 208d, 208e. The test response signals may be the response of each DUT of the plurality of DUTs 208a, 208b, 208c, 208d, 208e to the identical test signal provided to the plurality of DUTs 208a, 208b, 208c, 208d, 208e by the testing device 200-T.

Testing each DUT of the plurality of DUTs 208a, 208b, 208c, 208d, 208e may require the tester 212 to determine and/or calculate the rise timing and/or fall timing and/or delay time and/or slew rate of each DUT of the plurality of DUTs 208a, 208b, 208c, 208d, 208e. Testing of each DUT of the plurality of DUTs 208a, 208b, 208c, 208d, 208e may require the tester 212 to determine and/or calculate other parameters as well. Therefore, the aforementioned timings and slew rates are merely examples, and not meant to be limiting.

In one or more embodiments, there may be a need for the plurality of testing devices 200-T, 200-R to be synchronized to the tester 212. Therefore, in one or more embodiments, the at least one interface signal 216-T, 216-R, may include a synchronization signal configured to synchronize each testing device of the plurality of testing devices 200-T, 200-R with the tester 212. Accordingly, the circuit of each testing device of the plurality of testing devices 200-T, 200-R may be configured to receive the synchronization signal from the tester 212 through its respective signal interface. In one or more embodiments, the synchronization signal may be further configured to synchronize the plurality of testing devices 200-T, 200-R with each other. Accordingly, any subsequent determination and/or calculation by the tester 212 of the rise timing and/or fall timing and/or delay time and/or slew rate of each DUT of the plurality of DUTs 208a, 208b, 208c, 208d, 208e may be made with respect to a common time scale. In other words, timings for signals exchanged by the plurality of testing devices 200-T, 200-R and the tester 212 with the plurality of DUTs 208a, 208b, 208c, 208d, 208e may share a common start time, i.e. a common t=0 point.

Figure 4:
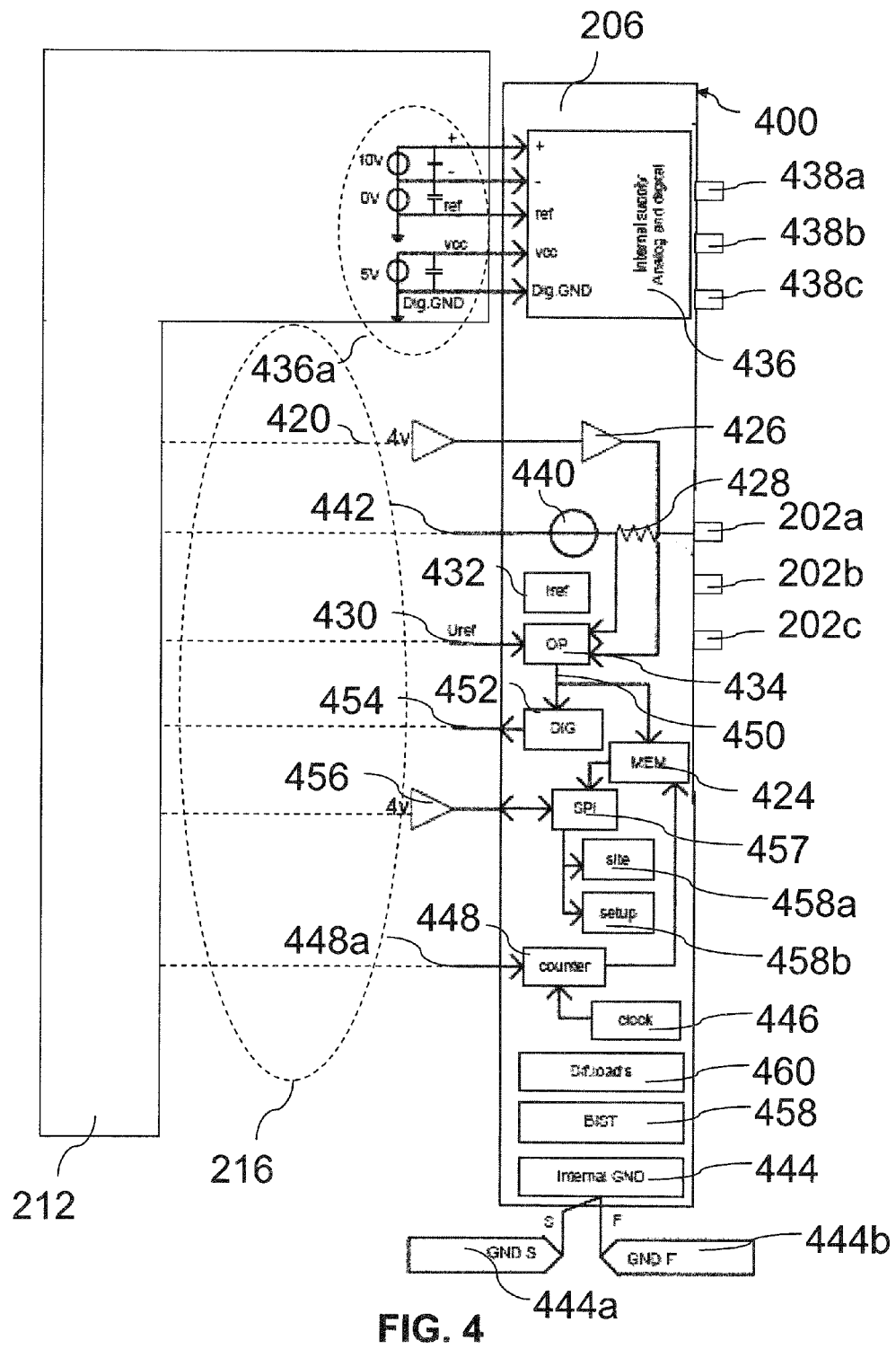
FIG. 4 shows a detailed block diagram of a testing device including a tester according to various embodiments.

FIG. 4 shows a detailed block diagram of a testing device 400 including a tester 212 according to various embodiments.

Reference signs in FIG. 4 that are the same as in FIG. 2 denote the same or similar elements as in FIG. 2. Thus, those elements will not be described in detail again here; reference is made to the description above. Differences between FIG. 4 and FIG. 2 are described below.

In one or more embodiments, the testing device 400 shown in FIG. 4 may be configured to provide identical first signals to each DUT of a plurality of DUTs (e.g. the testing device 200-T shown in FIG. 3). In one or more embodiments, the testing device 400 shown in FIG. 4 may be configured to receive identical first from each DUT of a plurality of DUTs (e.g. the testing device 200-R shown in FIG. 3). The testing device 400 according to each of these embodiments are described below, beginning with embodiments in which the identical first signal is provided by the circuit 206 of the testing device 400 to each DUT of the plurality of DUTs.

In one or more embodiments, the circuit 206 of the testing device 400 may be configured to provide the identical first signal to each DUT of a plurality of DUTs through the respective first terminal 202a, 202b, 202c. Only one circuit 206 is shown as an example, however, the number of circuits 206 may, for example, be two or more circuits 206 in some embodiments.

Only three first terminals 202a, 202b, 202c are shown as an example, however the number of first terminals 202a, 202b, 202c may be two or may be greater than three, and may, for example, be four, five, six, seven, eight, nine, or on the order of tens, hundreds, thousands of, or even more first terminals 202a, 202b, 202c in some embodiments.

The identical first signal provided by the testing device 400 through the respective first terminal 202a, 202b, 202c may depend on a reference signal 420 that may be known to the circuit 206. In one or more embodiments, the reference signal 420 known to the circuit 206 may be provided to the circuit by the tester 212 (as shown in FIG. 4). Therefore, in one or more embodiments, the at least one interface signal 216 exchanged with the tester 212 may include, or may be, the reference signal 420, as shown in FIG. 4. Accordingly, the circuit 206 may be configured to receive the reference signal 420 from the tester 212, as shown in FIG. 4. Stated differently, the reference signal 420 may be provided to the circuit 206 by the tester 212 through a signal interface (not shown in FIG. 4).

In one or more embodiments, the reference signal 420 known to the circuit 206 may be pre-programmed into the circuit 206. For example, the circuit 206 may include a memory 424 (also indicated as "MEM" in FIG. 4). The memory 424 may store the reference signal 420 programmed into the circuit 206 of the testing device 400.

In one or more embodiments, the identical first signal provided to each DUT may be a replication of the reference signal 420. Accordingly, in one or more embodiments, the circuit 206 may include at least one signal replicator 426 configured to replicate the reference signal 420 to form the identical first signal exchanged with each DUT of the plurality of DUTs through the respective first terminal 202a, 202b, 202c. FIG. 4 shows only one output of the at least one signal replicator 426, namely, the output to the first terminal 202a. However, there may be other outputs of the at least one signal replicator 426, each connecting to the other first terminals 202b, 202c.

In one or more embodiments, the identical first signal provided to each DUT may include, or may be, an identical test signal for testing each DUT of the plurality of DUTs. In other words, the identical test signal may be provided to each DUT of the plurality of DUTs as, or as part of, the identical first signal. Accordingly, the reference signal 420 known to the circuit 206 may include, or may be, a reference test signal for testing each DUT of the plurality of DUTs.

In one or more embodiments, the identical test signal provided to each DUT of the plurality of DUTs may include, or may be, at least one of an ascending ramp test signal, a descending ramp test signal, a step test signal, a trapezoidal test signal, and a plateau test signal, although other test signals may be possible as well in accordance with other embodiments.

In one or more embodiments, the testing device 400 may be configured to monitor the identical first signal provided to each DUT of the plurality of DUTs. Accordingly, in one or more embodiments, the circuit 206 may include at least one measurement device 428 configured to measure at least one of a voltage and a current of the identical first signal. For example, the circuit 206 may include at least one shunt resistor and/or a current shunt configured to measure the voltage and/or current of the identical first signal, as shown in FIG. 4. The testing device 400 may monitor the identical first signal provided to each DUT of the plurality of DUTs as part of the testing of each DUT of the plurality of DUTs. This is described below with respect to FIG. 5 and FIG. 6.

In one or more embodiments, monitoring the identical first signal provided to each DUT of the plurality of DUTs through a respective first terminal 202a, 202b, 202c may include comparing the voltage and/or current of the identical first signal with at least one signal reference 430 (also indicated as Uref in FIG. 4). In one or more embodiments, the at least one signal reference 430 may be provided to the circuit 206. For example, the at least one interface signal 216 may include the at least one signal reference 430, as shown in FIG. 4. Accordingly, the circuit 206 may be configured to receive the at least one signal reference 430 from the tester through the signal interface. In one or more embodiments, the at least one signal reference may be pre-programmed into the circuit 206 of the testing device 400. The at least one signal reference programmed into the circuit 206 is indicated as signal reference 432 in FIG. 4 (also indicated as Iref in FIG. 4).

In one or more embodiments, comparing the voltage and/or current of the identical first signal 214a, 214b, 214c with the at least one signal reference 430, 432 may be performed, for example, by means of at least one comparator 434. In other words, the circuit 206 may include at least one comparator 434 configured to compare at least one of the voltage and the current of the identical first signal with the at least one signal reference 430, 432.

In one or more embodiments, the circuit 206 may include at least one voltage supply 436 configured to provide power to the circuit 206. For example, the at least one voltage supply 436 may supply a power supply potential to at least one of the at least one comparator 434 and the at least one measurement 428. In one or more embodiments, the power supply potential may include, or may be, at least one of a digital voltage and an analog voltage.

In one or more embodiments, the at least one voltage supply 436 may receive at least one power supply input 436a. The at least one power supply input 436a may, for example, be provided to the at least one voltage supply 436 by the tester 212. In one or more embodiments, the interface signal 216 may include the at least one power supply input 436a, as shown in FIG. 4.

In one or more embodiments, the testing device 400 may provide a power supply potential to each DUT of the plurality of DUTs, e.g. by means of the first terminals 202a, 202b, 202c. For example, in one or more embodiments, a respective first terminal 202a, 202b, 202c may be configured to be connected to a respective DUT of the plurality of DUTs, and a power supply potential may be provided to each DUT of the plurality of DUTs by means of a respective first terminal 202a, 202b, 202c.

In addition to the above, in one or more embodiments, the circuit may include a variable, transient voltage source and/or a controllable current source 440.

In one or more embodiments, an input signal 442 to the variable transient voltage source and/or a controllable current source 440 may be provided by the tester 212. Accordingly, in one or more embodiments, the interface signal 216 may include, or may be, the input signal 442 to the variable transient voltage source and/or a controllable current source 440.

In one or more embodiments, the circuit 206 may include an internal ground potential 444 (also indicated as "Internal GND" in FIG. 4). The internal ground potential 444 may be a digital ground signal and/or an analog ground signal. The value of the internal ground potential 444 may depend on whether the plurality of first terminals 202a, 202b, 202c are providing the identical first signal or receiving the identical first signal. Accordingly, the internal ground potential 444 may include a sensing ground signal 444a (also indicated as "GND S" in FIG. 4) configured to be used when the plurality of first terminals 202a, 202b, 202c are receiving the identical first signal. In like manner, the internal ground potential 444 may include a forcing ground signal 444b (also indicated as "GND F" in FIG. 4) configured to be used when the plurality of first terminals 202a, 202b, 202c are providing the identical first signal.

In one or more embodiments, the circuit 206 may be configured to store at least one trigger time. The at least one trigger time may be defined as a time at which the voltage and/or the current of the identical first signal is at least substantially equal to at least one signal reference 430, 432 provided to the circuit 206 (e.g. by means of the at least one interface signal 216 and/or by pre-programming).

In one or more embodiments, the memory 424 may store the at least one trigger time. For example, in one or more embodiments, the circuit 206 may include at least one clock 446 and at least one counter 448. A value of the at least one counter 448 may be incremented by the clock 446, and the value of the at least one counter 448 may be stored in the memory 424. When the voltage and/or the current of the identical first signal is at least substantially equal to at least one signal reference 430, 432, the at least one comparator 434 may send an indication 450 to the memory 424. The indication 450 may cause the value of the at least one counter 448 to be stored as the at least one trigger time.

As described above, the testing device 400 may be synchronized with the tester (e.g. by means of a synchronization signal 448a). In one or more embodiments, the synchronization signal 448a may be provided by a counter of the tester 212 to synchronize the counter of the tester 212 with the counter 448 of the testing device 400. In one or more embodiments, the counter 448 of the testing device 400 may be set (e.g. set or reset to zero) by the tester 212 (e.g. by means of a controller, which may be included in the tester 212).

In one or more embodiments, the indication 450 may also be provided to at least one digital device 452 (also indicated as "DIG" in FIG. 4), configured to flip a bit in response to the indication 450. The at least one digital device 452 may generate a trigger signal 454 configured to indicate to the tester 212 that a trigger time has been stored in the memory 424.

In one or more embodiments, the at least one trigger time may be required by the tester 212 to determine and/or calculate, for example, the rise timing and/or fall timing and/or delay time and/or slew rate of each DUT of the plurality of DUTs. In one or more embodiments, information about the at least one trigger time may be provided by the testing device 400 to the tester. For example, the at least one interface signal 216 may include the information about the at least one trigger time. For example, the information about the at least one trigger time may be provided to the tester as control signal 456 by a serial peripheral interface bus 457. The interface signal 216 may include the control signal 456, as shown in FIG. 4. The circuit 206 may include the serial peripheral interface bus 457.

In one or more embodiments, the circuit 206 may include at least one controller 458a, 458b. The at least one controller 458a, 458b may be configured to control the operation of the testing device 400. For example, the at least one controller 458a, 458b may control the functioning of the plurality of first terminals 202a, 202b, 202c. For example, the at least one controller 458a, 458b may control if the plurality of first terminals 202a, 202b, 202c provides and/or receives the identical first signal. In one or more embodiments, the at least one controller 458a, 458b may be used to provide the testing device 400 with information about the plurality of DUTs. The operation of the at least one controller 458a, 458b may be controlled by the control signal 456, which may be exchanged with the tester 212.

The at least one controller may be implemented by means of a peripheral controller. The peripheral controller may, for example, be implemented by means of a field programmable gate array (FPGA) or a microprocessor, or a Programmable Logic Device (PLD).

In one or more embodiments, the circuit 206 may include at least one built-in-self-test 458 (also indicated as "BIST" in FIG. 4). The at least one built-in-self-test 458 may be used by the testing device 400 to test the circuit 206 of the testing device 400. In one or more embodiments, the circuit 206 may include at least differential load 460. The at least one differential load 460 may include at least one of a pull-up and a pull-down differential load 460.

The description above provides examples where the identical first signal may be provided by the circuit 206 of the testing device 400 to each DUT of the plurality of DUTs through the respective first terminal 202a, 202b, 202c. This may be referred to as a driving mode of the testing device 400. As described above, the testing device 400 may be used in embodiments in which the identical first signal is received by the circuit 206 of the testing device 400 from each DUT of the plurality of DUTs through the respective first terminal 202a, 202b, 202c. Such an example may be referred to as a receiving mode of the testing device 400. The description that follows provides examples of the receiving mode of the testing device 400.

In one or more embodiments, receipt of the identical first signal from each DUT of the plurality of DUTs 208a, 208b, 208c may be controlled by means of the controller 458a, 458b.

In one or more embodiments, the identical first signal received from each DUT of the plurality of DUTs may include a test response signal. For example, the test response signal may be a response of a DUT of the plurality of DUTs to an identical test signal provided to each DUT of the plurality of DUTs. Accordingly, the first signals may be identical to each other in that each first signal may be a response to an identical test signal. In one or more embodiments, the identical test signal may be provided to each DUT of the plurality of DUTs by another testing device, namely, a testing device other than the testing device 400. For example, as shown in FIG. 3, the testing device 200-T may be configured to provide the signal 214-T to each DUT of the plurality of DUTs 208a to 208e, while the testing device 200-R may be configured to receive the signal 214-R (e.g. a response to the test signal) from the plurality of DUTs 208a to 208e.

In one or more embodiments, the testing device 400 may be configured to monitor the identical first signal received from each DUT of the plurality of DUTs, for example, by means of the at least one measurement device 434 (e.g. at least one shunt resistor and/or current shunt).

In one or more embodiments, monitoring the identical first signal (e.g. test response signal) received from each DUT of the plurality of DUTs may include comparing the voltage and/or current of the identical first signal (e.g. by means of the at least one comparator 434) with at least one signal reference 430, 432.

In one or more embodiments, the circuit 206 may be configured to store (e.g. in the memory 424) at least one trigger time, namely the time at which the voltage and/or the current of the identical first signal (e.g. test response signal) is at least substantially equal to at least one signal reference 430, 432 provided to the circuit 206.

In one or more embodiments, the at least one interface signal 216 may include information about the at least one trigger time. Accordingly, the circuit 206 may be configured to provide the information about the at least one trigger time to the tester 212. For example, the information about the at least one trigger time may be provided to the tester 212 as control signal 456 (which may be included in the interface signal 216) by the serial peripheral interface bus 457. The further features described above in respect of the testing device 400 providing the identical first signal may be applicable to the testing device 400 receiving the identical first signal.

Figure 5A:
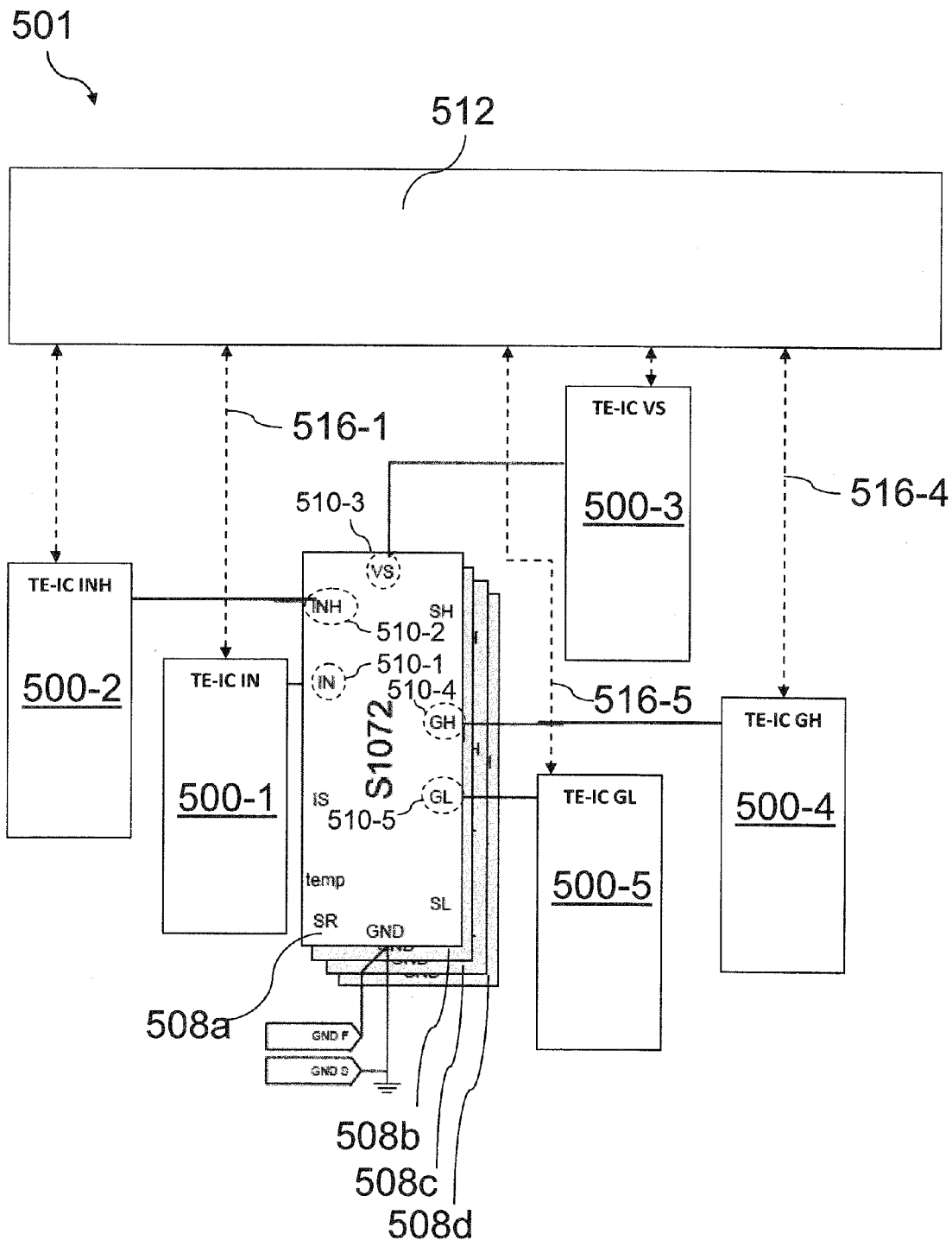

FIG. 5A shows a circuit arrangement 501 for testing various timings of each DUT of a plurality of DUTs according to various embodiments.

Reference signs in FIG. 5A that are the same as in FIG. 4 denote the same or similar elements as in FIG. 4. Thus, those elements will not be described in detail again here; reference is made to the description above. Differences between FIG. 5A and FIG. 4 are described below.

The circuit arrangement 501 may include a plurality of DUTs 508a, 508b, 508c, 508d; a tester 512; and a plurality of testing devices 500-1 (also indicated as "TE-IC IN" in FIG. 5A), 500-2 (also indicated as "TE-IC INH" in FIG. 5A), 500-3 (also indicated as "TE-IC VS" in FIG. 5A), 500-4 (also indicated as "TE-IC GH" in FIG. 5A), 500-5 (also indicated as "TE-IC GL" in FIG. 5A). Each testing device 500-1, 500-2, 500-3, 500-4, 500-5 may be configured according to the testing device 400 shown in FIG. 4.

As shown in FIG. 5A, the DUT 508a of the plurality of DUTs 508a, 508b, 508c, 508d may include a plurality of pins 510-1 (also indicated as "IN" pin in FIG. 5A), 510-2 (also indicated as "INH" pin in FIG. 5A), 510-3 (also indicated as "VS" pin in FIG. 5A), 510-4 (also indicated as "GH" pin in FIG. 5A), 510-5 (also indicated as "GL" pin in FIG. 5A). Each pin of the DUT 508a may be connected to a respective testing device. For example, the pin 510-1 may be connected to the testing device 500-1; the pin 510-2 may be connected to the testing device 500-2; the pin 510-3 may be connected to the testing device 500-3; the pin 510-4 may be connected to the testing device 500-4; the pin 510-5 may be connected to the testing device 500-5.

Although not shown in FIG. 5A, the testing device 500-1 may also be connected to the IN pin of each of the other DUTs of the plurality of DUTs 508a, 508b, 508c, 508d. In like manner, the testing device 500-2 may also be connected to the INH pin of each of the other DUTs of the plurality of DUTs 508a, 508b, 508c, 508d. The testing device 500-3 may also be connected to the VS pin of each of the other DUTs of the plurality of DUTs 508a, 508b, 508c, 508d. The testing device 500-4 may also be connected to the GH pin of each of the other DUTs of the plurality of DUTs 508a, 508b, 508c, 508d. The testing device 500-5 may also be connected to the GL pin of each of the other DUTs of the plurality of DUTs 508a, 508b, 508c, 508d.

The circuit arrangement 501 may be used for testing various timings of the plurality of DUTs 508a, 508b, 508c, 508d. For example, the testing device 500-3 may provide each DUT of the plurality of DUTs 508a, 508b, 508c, 508d with a power supply potential. A digital source in the tester 512 may generate a reference test signal (e.g. a step signal) and may provide the testing device 500-1 with the reference test signal. The reference test signal may be included in the interface signal 516-1 exchanged between the tester 512 and the testing device 500-1. An example of the reference test signal is shown in FIG. 5B, with the horizontal axis denoting time increasing from left to right, and the vertical axis denoting voltage (in volts) increasing from bottom to top. The curve of FIG. 5B is not drawn to scale.

The testing device 500-1 may replicate the reference test signal (e.g. by means of a signal replicator) to form an identical test signal for testing the plurality of DUTs 508a, 508b, 508c, 508d. The testing device 500-1 may simultaneously provide the identical test signal to each DUT of the plurality of DUTs 508a, 508b, 508c, 508d. For example, the testing device 500-1 may provide the identical test signal shown in FIG. 5B to each "IN" pin of each DUT of the plurality of DUTs 508a, 508b, 508c, 508d. For the sake of simplicity and ease of understanding, the testing device 500-1 is shown to provide the identical test signal to the "IN" pin 510-1 of the DUT 508a in FIG. 5A.

As described above, the testing device 500-1 may compare (e.g. by means of a comparator) the identical signal provided to each DUT of the plurality of DUTs 508a, 508b, 508c, 508d to at least one signal reference. For example, the at least one signal reference known to the testing device 500-1 may be a voltage v1 (shown in FIG. 5B). Accordingly, the testing device 500-1 may be configured to store at least one trigger time, namely a time at which a voltage of the identical test signal (e.g. the test signal shown in FIG. 5B) is at least substantially equal to the voltage v1. As shown in FIG. 5B, the identical test signal may be at least substantially equal to the voltage v1 at times t1 and t6. Accordingly, testing device 500-1 may store times t1 and t6 as the at least one trigger time.

A response of each DUT to the identical test signal (e.g. the test signal shown in FIG. 5B) provided to the plurality of DUTs 508a, 508b, 508c, 508d may be received by testing devices other than testing device 500-1. For example, after a certain dead time, a test response signal from the GH pin of each DUT may be received. For example, the testing device 500-4 may be configured to receive the test response signal from the GH pin of each DUT of the plurality of DUTs 508a, 508b, 508c, 508d, as shown in FIG. 5. An example of the test response signal at the GH pin of the DUT 508a is shown in FIG. 5C, with the horizontal axis denoting time increasing from left to right, and the vertical axis denoting voltage (in volts) increasing from bottom to top. The curve of FIG. 5C is not drawn to scale. The at least one signal reference known to the testing device 500-4 may be the voltages v2 and v3 (shown in FIG. 5C). Accordingly, the testing device 500-4 may be configured to store at least one trigger time, namely a time at which a voltage of the test response signal (e.g. the test response signal shown in FIG. 5C) is at least substantially equal to the voltage v2 or the voltage v3. As shown in FIG. 5B, the test response signal may be at least substantially equal to the voltages v2 or v3 at times t2, t3, t9, and t10. Accordingly, the testing device 500-4 may store times t2, t3, t9, and t10 as the at least one trigger time.

In like manner, after a certain dead time, a test response signal from the GL pin of each DUT may be received. For example, the testing device 500-5 may be configured to receive the test response signal from the GL pin of each DUT of the plurality of DUTs 508a, 508b, 508c, 508d, as shown in FIG. 5A. An example of the test response signal at the GL pin of the DUT 508a is shown in FIG. 5D, with the horizontal axis denoting time increasing from left to right, and the vertical axis denoting voltage (in volts) increasing from bottom to top. The curve of FIG. 5D is not drawn to scale. The at least one signal reference known to the testing device 500-5 may be the voltages v4 and v5 (shown in FIG. 5D). Accordingly, the testing device 500-5 may be configured to store at least one trigger time, namely a time at which a voltage of the test response signal (e.g. the test response signal shown in FIG. 5D) is at least substantially equal to the voltage v4 or the voltage v5. As shown in FIG. 5D, the test response signal may be at least substantially equal to the voltages v2 or v3 at times t4, t5, t7, and t8. Accordingly, the testing device 500-5 may store times t4, t5, t7, and t8 as the at least one trigger time.

As described above in relation to FIG. 3, the plurality of testing devices 500-1, 500-2, 500-3, 500-4, 500-5 may be synchronized with each other and/or with the tester 512. Further, information about the at least one trigger time of each of the testing devices may be provided to the tester 512 (e.g. by means of a serial peripheral interface bus). For example, the testing device 500-1 may provide the trigger times t1 and t6 to the tester 512 using the interface signal 516-1. The testing device 500-4 may provide the trigger times t2, t3, t9, and t10 to the tester 512 using the interface signal 516-4. The testing device may provide the trigger times t4, t5, t7, and t8 to the tester 512 using the interface signal 516-5. Thereafter, various timings of each DUT of the plurality of DUTs 508a, 508b, 508c, 508d may be calculated by the tester 512 and/or a processing circuit (e.g. a processing unit, e.g. a central processing unit), which may be included in the testing device.

For example, a delay time between the "IN" pin and the "GH" pin of the DUT 508a may be calculated as t2–t1. A delay time for the "GL" pin of the DUT 508a may be calculated as t7–t6. Another delay time of the "GL" pin of the DUT 508a may be calculated as t4–t1. A rise time of the "GH" pin of the DUT 508a may be calculated as t3–t2. A fall time of the "GL" pin of the DUT 508a may be calculated as t8–t7. A dead time between the "GH" pin and the "GL" pin of the DUT 508a may be calculated as t4–t3. A dead time between the "GL" pin and the "GH" pin of the DUT 508a may be calculated as t9–t8. A delay time of the "GH" pin of the DUT 508a may be calculated as t9–t6. A rise time of the "GL" pin of the DUT 508a may be calculated as t5–t4. A fall time of the "GH" pin of the DUT 508a may be calculated as t10–t9.

Figure 6A:
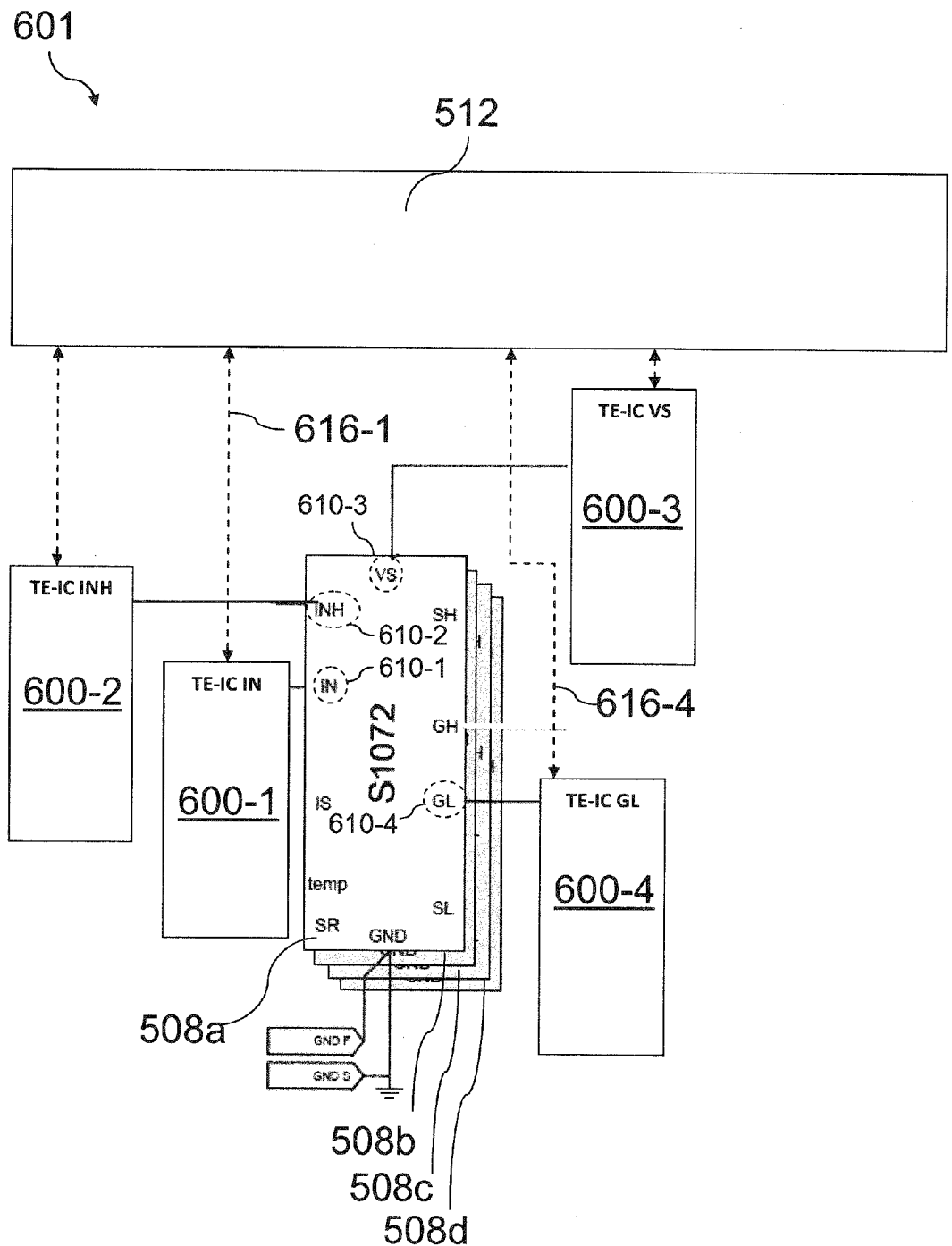

FIG. 6A shows a circuit arrangement 601 for testing various timings of a plurality of DUTs according to various embodiments.

Reference signs in FIG. 6A that are the same as in FIG. 5A denote the same or similar elements as in FIG. 5A. Thus, those elements will not be described in detail again here; reference is made to the description above. Differences between FIG. 6A and FIG. 5A are described below.

The circuit arrangement 601 may include a plurality of DUTs 508a, 508b, 508c, 508d; a tester 512; and a plurality of testing devices 600-1 (also indicated as "TE-IC IN" in FIG. 6A), 600-2 (also indicated as "TE-IC INH" in FIG. 6A), 600-3 (also indicated as "TE-IC VS" in FIG. 6A), 600-4 (also indicated as "TE-IC GL" in FIG. 6A). Each testing device 600-1, 600-2, 600-3, 600-4 may be configured according to the testing device 400 shown in FIG. 4.

As shown in FIG. 6A, the DUT 508a of the plurality of DUTs 508a, 508b, 508c, 508d may include a plurality of pins 610-1 (also indicated as "IN" pin in FIG. 6A), 610-2 (also indicated as "INH" pin in FIG. 6A), 610-3 (also indicated as "VS" pin in FIG. 6A), 610-4 (also indicated as "GL" pin in FIG. 6A). Each pin of the DUT 508a may be connected to a respective testing device. For example, the pin 610-1 may be connected to the testing device 600-1; the pin 610-2 may be connected to the testing device 600-2; the pin 610-3 may be connected to the testing device 600-3; the pin 610-4 may be connected to the testing device 600-4.

Although not shown in FIG. 6A, the testing device 600-1 may also be connected to the IN pin of each of the other DUTs of the plurality of DUTs 508a, 508b, 508c, 508d. In like manner, the testing device 600-2 may also be connected to the INH pin of each of the other DUTs of the plurality of DUTs 508a, 508b, 508c, 508d. The testing device 600-3 may also be connected to the VS pin of each of the other DUTs of the plurality of DUTs 508a, 508b, 508c, 508d. The testing device 600-4 may also be connected to the GL pin of each of the other DUTs of the plurality of DUTs 508a, 508b, 508c, 508d.

The circuit arrangement 601 may be used for testing various timings of the plurality of DUTs 508a, 508b, 508c, 508d. For example, the testing device 600-3 may provide each DUT of the plurality of DUTs 508a, 508b, 508c, 508d with a power supply potential (e.g. through a plurality of power supply terminals of the testing device 600-3). A digital source in the tester 512 may generate a reference test signal (e.g. a ramp signal) and may provide the testing device 600-1 with the reference test signal. The reference test signal may be included in the interface signal 616-1 exchanged between the tester 512 and the testing device 600-1. An example of the reference test signal is shown in FIG. 6B, with the horizontal axis denoting time increasing from left to right, and the vertical axis denoting voltage (in volts) increasing from bottom to top. The curve of FIG. 6B is not drawn to scale.

The testing device 600-1 may replicate the reference test signal (e.g. by means of a signal replicator) to form an identical test signal for testing the plurality of DUTs 508a, 508b, 508c, 508d. The testing device 600-1 may simultaneously provide the identical test signal to each DUT of the plurality of DUTs 508a, 508b, 508c, 508d. For example, the testing device 600-1 may provide the identical test signal shown in FIG. 6B to each "IN" pin of each DUT of the plurality of DUTs 508a, 508b, 508c, 508d. For the sake of simplicity and ease of understanding, the testing device 600-1 is shown to provide the identical test signal to the "IN" pin 610-1 of the DUT 508a in FIG. 6A.

As described above, the testing device 600-1 may compare (e.g. by means of a comparator) the identical signal provided to each DUT of the plurality of DUTs 508a, 508b, 508c, 508d to at least one signal reference. For example, the at least one signal reference known to the testing device 600-1 may be a voltage v1 and a voltage v2 (shown in FIG. 6B). Accordingly, the testing device 500-1 may be configured to store at least one trigger time, namely a time at which a voltage of the identical test signal (e.g. the test signal shown in FIG. 6B) is at least substantially equal to the voltage v1 or the voltage v2. As shown in FIG. 6B, the identical test signal may be at least substantially equal to the voltage v1 at times t2 and t3, and may be at least substantially equal to the voltage v2 at times t1 and t4. Accordingly, testing device 500-1 may store times t1, t2, t3 and t4 as the at least one trigger time.

A response of each DUT to the identical test signal (e.g. the test signal shown in FIG. 6B) provided to the plurality of DUTs 508a, 508b, 508c, 508d may be received by testing devices other than testing device 600-1. For example, after a certain dead time, a test response signal from the GL pin of each DUT may be received. For example, the testing device 600-4 may be configured to receive the test response signal from the GL pin of each DUT of the plurality of DUTs 508a, 508b, 508c, 508d, as shown in FIG. 6A. An example of the test response signal at the GL pin of the DUT 508a is shown in FIG. 6C, with the horizontal axis denoting time increasing from left to right, and the vertical axis denoting voltage (in volts) increasing from bottom to top. The curve of FIG. 6C is not drawn to scale.

The at least one signal reference known to the testing device 600-4 may be the voltage v3 (shown in FIG. 6C). Accordingly, the testing device 600-4 may be configured to store at least one trigger time, namely a time at which a voltage of the test response signal (e.g. the test response signal shown in FIG. 6C) is at least substantially equal to the voltage v3. As shown in FIG. 6C, the test response signal may be at least substantially equal to the voltage v3 at times t5 and t6. Accordingly, the testing device 500-4 may store times t5 and t6 as the at least one trigger time.

As described above in relation to FIG. 3, the plurality of testing devices 600-1, 600-2, 600-3, 600-4, 600-5 may be synchronized with each other and/or with the tester 512. For example, the plurality of testing devices 600-1, 600-2, 600-3, 600-4, 600-5 may be synchronized with each other by means of a connection (e.g. communicative and/or electrical connection) among the plurality of testing devices 600-1, 600-2, 600-3, 600-4, 600-5 (e.g. a daisy chain connection, which may connect the plurality of testing devices 600-1, 600-2, 600-3, 600-4, 600-5). Further, information about the at least one trigger time of each of the testing devices may be provided to the tester 512 (e.g. by means of a serial peripheral interface bus). For example, the testing device 600-1 may provide the trigger times t1, t2, t3 and t4 to the tester 512 using the interface signal 616-1. The testing device 500-4 may provide the trigger times t5 and t6 to the tester 512 using the interface signal 616-4. Thereafter, various timings of each DUT of the plurality of DUTs 508a, 508b, 508c, 508d may be calculated by the tester 512 and/or a processing circuit (e.g. a processing unit, e.g. a central processing unit), which may be included in the testing device. The various timings of each DUT of the plurality of DUTs 508a, 508b, 508c, 508d may be calculated with respect to a common time scale.

For example, an ascending ramp slew rate of the DUT 508a may be calculated as (v1−v2)/(t2−t1). A descending ramp slew rate of the DUT 508a may be calculated as (v2−v1)/(t4−t3). An ascending input reference of the DUT 508a may be calculated as [v2+ascending ramp slew rate*(t5−t1)]. A descending input reference of the DUT 508a may be calculated as [v1+descending ramp slew rate*(t6−t3)].

Figure 7:
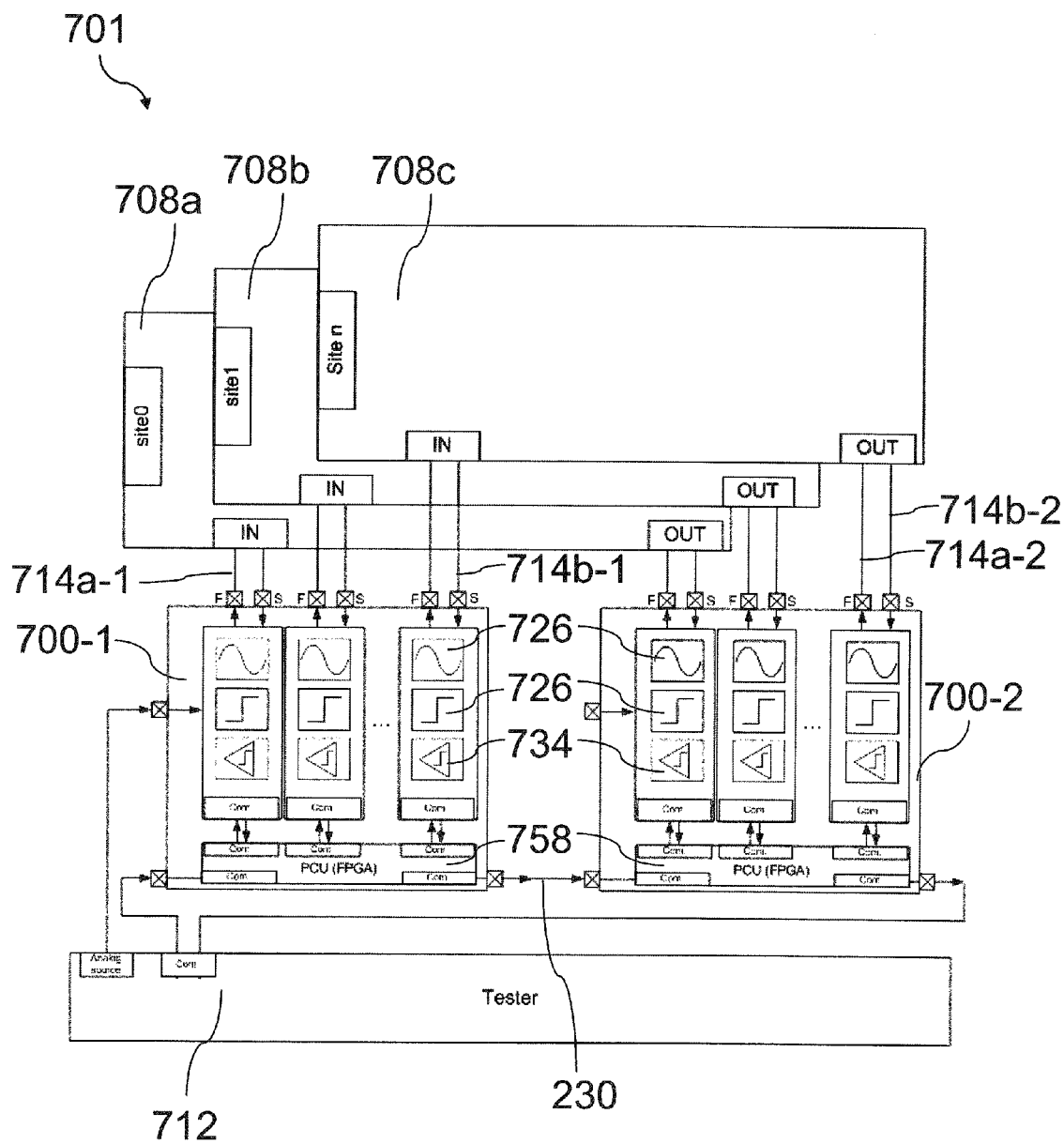
FIG. 7 shows a block diagram of a circuit arrangement according to various embodiments.

FIG. 7 shows a block diagram of a circuit arrangement 701 according to various embodiments.

The circuit arrangement shown in FIG. 7 may include a plurality of testing devices 700-1, 700-2; a tester 712; and a plurality of DUTs 708a, 708b, 708c. As shown in FIG. 7, circuit of each testing device of the plurality of testing devices 700-1, 700-2 may include at least one signal replicator 726, at least one signal comparator 734; and at least one controller 758 (e.g. a peripheral controller (PCU)).

In one or more embodiments, a testing device of the plurality of testing devices 700-1, 700-2 may include a plurality of first terminals and a plurality of second terminals, each configured to be connected to the plurality of DUTs 708a, 708b, 708c. For example, as shown in FIG. 7, the testing device 700-1 includes a plurality of first terminals (indicated as "F" in FIG. 7), and a plurality of second terminals (indicated as "S" in FIG. 7). In like manner, the testing device 700-2 includes a plurality of first terminals (indicated as "F" in FIG. 7), and a plurality of second terminals (indicated as "S" in FIG. 7). The plurality of first terminals may also be referred to as a plurality of force terminals and the plurality of second terminals may also be referred to as a plurality of sense terminals.

In one or more embodiments, each first terminal of the plurality of first terminals may be configured to be connected to a respective DUT. For example, as shown in FIG. 7, each first terminal (indicated as "F") of the testing device 700-1 is connected to a respective DUT of the plurality of DUTs 708a, 708b, 708c. In like manner, each second terminal (indicated as "S") of the testing device 700-1 is connected to a respective DUT of the plurality of DUTs 708a, 708b, 708c. A similar connection maybe observed between the testing device 700-2 and the plurality of DUTs 708a, 708b, 708c.

In one or more embodiments, the circuit of the testing device 700-1 may be configured to provide an identical first signal 714a-1 to each DUT of the plurality of DUTs 708a, 708b, 708c through the respective first terminal (indicated as "F"), and to receive an identical second signal 714b-1 from each DUT of the plurality of DUTs 708a, 708b, 708c through a respective second terminal (indicated as "S") of the plurality of second terminals. In a similar manner, the circuit of the testing device 700-2 may be configured to provide an identical first signal 714a-2 to each DUT of the plurality of DUTs 708a, 708b, 708c through the respective first terminal (indicated as "F"), and to receive an identical second signal 714b-2 from each DUT of the plurality of DUTs 708a, 708b, 708c through a respective second terminal (indicated as "S") of the plurality of second terminals.

The examples provided above may describe embodiments where a testing device may exchange at least one interface signal with a tester and an identical first signal with each DUT of a plurality of DUTs. In other words, the embodiments described above may provide examples where the testing device may be configured to operate with a tester to test a plurality of DUTs. In one or more embodiments, the testing device may be configured to operate without a tester to test a plurality of DUTs. In such an embodiment, the testing device may be controlled by means of a control circuit, which may, for example, be external to the testing device and which may, for example, be included in a circuit arrangement (e.g. a motherboard). The testing device may, for example, be included in the circuit arrangement, e.g. and may be coupled (e.g. communicatively and/or electrically coupled) to the control circuit.

In one or more embodiments, the identical first signal may include, or may be, an identical test signal for testing each DUT of the plurality of DUTs 708a, 708b, 708c. For example, in the testing device 700-1, the identical first signal 714a-1 may be a test signal provided to the "IN" terminal of each DUT of the plurality of DUTs 708a, 708b, 708c. In one or more embodiments, the identical second signal may include, or may be, a feedback signal of the identical test signal provided to each DUT of the plurality of DUTs 708a, 708b, 708c. For example, in the testing device 700-1, the identical second signal 714b-1 may be a feedback signal of the identical test signal 714a-1 provided to the plurality of DUTs 708a, 708b, 708c. In this way, the testing device 700-1 may regulate the identical first signal 714a-1 (e.g. dentical test signal) provided to the plurality of DUTs 708a, 708b, 708c. For example, the circuit may include at least one feedback controller configured to compare the identical second signal 714b-1 to at least one signal reference, and to adjust at least one of a voltage and a current of the identical first signal 714a-1 based on the result of the comparison of the identical second signal 714b-1 to the at least one signal reference.

A testing device in accordance with various embodiments may include: a plurality of first terminals configured to be connected to a plurality of devices-under-test (DUTs), wherein each first terminal of the plurality of first terminals may be configured to be connected to a respective DUT of the plurality of DUTs; a signal interface configured to be connected to a tester; and circuit configured to exchange an identical first signal with each DUT of the plurality of DUTs through a respective first terminal of the plurality of first terminals, and to exchange at least one interface signal with the tester through the signal interface.

In one or more embodiments, the respective first terminal may be configured to be connected to a respective pin of the respective DUT, wherein the respective pins of the respective DUTs may be configured to provide the same (technical) function (e.g. for an identical technical use) in each respective DUT.

In one or more embodiments, the circuit may be configured to provide the identical first signal to each DUT of the plurality of DUTs through the respective first terminal.

In one or more embodiments, the identical first signal may include an identical test signal for testing each DUT of the plurality of DUTs.

In one or more embodiments, the at least one interface signal may include a reference signal, wherein the circuit may be configured to receive the reference signal from the tester through the signal interface, and to replicate the reference signal to form the identical first signal exchanged with each DUT of the plurality of DUTs.

In one or more embodiments, the reference signal may include a reference test signal for testing each DUT of the plurality of DUTs.

In one or more embodiments, the circuit may include at least one signal replicator configured to replicate a reference signal to form the identical first signal exchanged with each DUT of the plurality of DUTs.

In one or more embodiments, the reference signal may be provided to the circuit by the tester through the signal interface.

In one or more embodiments, the reference signal may be pre-programmed into the circuit.

In one or more embodiments, the circuit may be configured to receive the identical first signal from each DUT of the plurality of DUTs through the respective first terminal.

In one or more embodiments, the identical first signal may include a test response signal, wherein the test response signal may be a response of a DUT of the plurality of DUTs to an identical test signal provided to each DUT of the plurality of DUTs.

In one or more embodiments, the at least one interface signal may include at least one signal reference, wherein the circuit may be configured to receive the at least one signal reference from the tester through the signal interface.

In one or more embodiments, the circuit may be further configured to store at least one trigger time, wherein the at least one trigger time may be a time at which a voltage and/or a current of the identical first signal may be at least substantially equal to at least one signal reference provided to the circuit.

In one or more embodiments, the circuit may include a memory for storing the at least one trigger time.

In one or more embodiments, the at least one interface signal may include information about the at least one trigger time, and wherein the circuit may be configured to provide the information about the at least one trigger time to the tester through the signal interface.

In one or more embodiments, the at least one interface signal may include a synchronization signal configured to synchronize the testing device with the tester, and wherein the circuit may be configured to receive the synchronization signal from the tester through the signal interface.

In one or more embodiments, the circuit may include at least one measurement device configured to measure at least one of a voltage and a current of the identical first signal.

In one or more embodiments, the circuit may include at least one comparator configured to compare at least one of a voltage and a current of the identical first signal with at least one signal reference provided to the circuit.

In one or more embodiments, the circuit may include a serial peripheral interface bus.

In one or more embodiments, the circuit may include a peripheral controller.

In one or more embodiments, the peripheral controller may include a field programmable gate array.

In one or more embodiments, the testing device may further include a plurality of second terminals configured to be connected to the plurality of DUTs, wherein each second terminal of the plurality of second terminals is configured to be connected to a respective DUT, wherein the circuit may be configured to provide the identical first signal to each DUT of the plurality of DUTs through the respective first terminal of the plurality of first terminals, and to receive an identical second signal from each DUT of the plurality of DUTs through a respective second terminal of the plurality of second terminals.

In one or more embodiments, the identical first signal may include an identical test signal for testing each DUT of the plurality of DUTs, and wherein the identical second signal may include a feedback signal of the identical test signal provided to each DUT of the plurality of DUTs.

In one or more embodiments, the circuit may include at least one feedback controller configured to compare the identical second signal to at least one signal reference, and to adjust at least one of a voltage and/or a current of the identical first signal based on the result of the comparison of the identical second signal to the at least one signal reference.

A circuit arrangement in accordance with various embodiments may include: a plurality of devices-under-test (DUTs); a tester; at least one first testing device configured to provide an identical first signal to the plurality of DUTs, and to exchange at least one first interface signal with the tester; and at least one second testing device configured to receive an identical second signal from the plurality of DUTs, and to exchange at least one second interface signal with the tester, wherein a testing device of at least one first testing device and the at least one second testing device includes a plurality of first terminals configured to be connected to the plurality of DUTs, wherein each first terminal of the plurality of first terminals is configured to be connected to a respective DUT of the plurality of DUTs. It is to be noted that in various embodiments, the interface signal may be configured in a daisy chain, i.e. one testing device may be connected to the other testing device and this will send out the signal over one or more interfaces to the tester. This might save input/output terminals at the tester.

A circuit arrangement in accordance with various embodiments may include: a plurality of devices-under-test; a control circuit; at least one first testing device configured to provide an identical first signal to the plurality of devices-under-test, and to exchange at least one first interface signal with the control circuit; and at least one second testing device configured to receive an identical second signal from the plurality of devices-under-test, and to exchange at least one second interface signal with the control circuit, wherein a testing device of at least one first testing device and the at least one second testing device comprises a plurality of first terminals configured to be connected to the plurality of devices-under-test, wherein each first terminal of the plurality of first terminals is configured to be connected to a respective device-under-test of the plurality of devices-under-test. It is to be noted that in various embodiments, the interface signal may be configured in a daisy chain, i.e. one testing device may be connected to the other testing device and this will send out the signal over one or more interfaces to the tester. This might save input/output terminals at the tester.

While various aspects of this disclosure have been particularly shown and described with reference to these aspects of this disclosure, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:
1. A testing device, comprising:
   a plurality of first terminals configured to be connected to a plurality of devices-under-test, wherein each first terminal of the plurality of first terminals is configured to be connected to a respective device-under-test of the plurality of devices-under-test;

a signal interface configured to be connected to a tester; and
a circuit configured to exchange an identical first signal with each device-under-test of the plurality of devices-under-test through a respective first terminal of the plurality of first terminals, and to exchange at least one interface signal with the tester through the signal interface; and
wherein the identical first signal comprises a test response signal, and wherein the test response signal is a response of a device-under-test of the plurality of devices-under-test to an identical test signal provided to each device-under-test of the plurality of devices-under-test.

2. The testing device of claim 1,
wherein the respective first terminal is configured to be connected to a respective pin of the respective device-under-test, and wherein the respective pins of the respective devices-under-test are configured to provide the same function in each respective device-under-test.

3. The testing device of claim 1,
wherein the circuit is configured to provide the identical first signal to each device-under-test of the plurality of devices-under-test via the respective first terminal.

4. The testing device of claim 1,
wherein the identical first signal comprises an identical test signal for testing each device-under-test of the plurality of devices-under-test.

5. The testing device of claim 1,
wherein the at least one interface signal comprises a reference signal, and
wherein the circuit is configured to receive the reference signal from the tester via the signal interface, and to replicate the reference signal to form the identical first signal exchanged with each device-under-test of the plurality of devices-under-test.

6. The testing device of claim 1,
wherein the circuit comprises at least one signal replicator configured to replicate a reference signal to form the identical first signal exchanged with each device-under-test of the plurality of devices-under-test.

7. The testing device of claim 1,
wherein the circuit is configured to receive the identical first signal from each device-under-test of the plurality of devices-under-test via the respective first terminal.

8. The testing device of claim 1,
wherein the at least one interface signal comprises at least one signal reference, and
wherein the circuit is configured to receive the at least one signal reference from the tester via the signal interface.

9. The testing device of claim 1,
wherein the circuit is further configured to store at least one trigger time,
wherein the at least one trigger time is a time at which at least one of a voltage and/or a current of the identical first signal is at least substantially equal to at least one signal reference provided to the circuit.

10. The testing device of claim 9,
wherein the at least one interface signal comprises information about the at least one trigger time, and
wherein the circuit is configured to provide the information about the at least one trigger time to the tester through the signal interface.

11. The testing device of claim 1,
wherein the at least one interface signal comprises a synchronization signal configured to synchronize the testing device with the tester, and
wherein the circuit is configured to receive the synchronization signal from the tester via the signal interface.

12. The testing device of claim 1, further comprising:
a plurality of power supply terminals configured to provide a power supply potential to each device-under-test of the plurality of devices-under-test.

13. The testing device of claim 1,
wherein the circuit comprises at least one measurement device configured to measure at least one of a voltage and/or a current of the identical first signal.

14. The testing device of claim 1,
wherein the circuit comprises at least one comparator configured to compare at least one of a voltage and/or a current of the identical first signal with at least one signal reference provided to the circuit.

15. The testing device of claim 1, further comprising:
at least one voltage supply configured to provide a power supply potential to the circuit.

16. The testing device of claim 1,
wherein the circuit comprises a serial peripheral interface bus.

17. The testing device of claim 1,
wherein the circuit comprises a peripheral controller.

18. The testing device of claim 1, further comprising:
a plurality of second terminals configured to be connected to the plurality of devices-under-test, wherein each second terminal of the plurality of second terminals is configured to be connected to a respective device-under-test,
wherein the circuit is configured to provide the identical first signal to each device-under-test of the plurality of devices-under-test via the respective first terminal of the plurality of first terminals, and to receive an identical second signal from each device-under-test of the plurality of devices-under-test through a respective second terminal of the plurality of second terminals.

19. A circuit arrangement, comprising:
a plurality of devices-under-test;
a tester;
at least one first testing device configured to provide an identical first signal to the plurality of devices-under-test, and to exchange at least one first interface signal with the tester; wherein the identical first signal comprises a test response signal, and wherein the test response signal is a response of a device-under-test of the plurality of devices-under-test to an identical test signal provided to each device-under-test of the plurality of devices-under-test; and
at least one second testing device configured to receive an identical second signal from the plurality of devices-under-test, and to exchange at least one second interface signal with the tester,
wherein a testing device of at least one first testing device and the at least one second testing device comprises a plurality of first terminals configured to be connected to the plurality of devices-under-test, wherein each first terminal of the plurality of first terminals is configured to be connected to a respective device-under-test of the plurality of devices-under-test.

20. A circuit arrangement, comprising:
a plurality of devices-under-test;
a control circuit;
at least one first testing device configured to provide an identical first signal to the plurality of devices-under-test, and to exchange at least one first interface signal with the control circuit; wherein the identical first signal comprises a test response signal, and wherein the test response signal is a response of a device-under-test of the plurality of devices-under-test to an identical test signal provided to each device-under-test of the plurality of devices-under-test; and at least one second testing device configured to receive an identical second signal from the plurality of devices-under-test, and to exchange at least one second interface signal with the control circuit, wherein a testing device of at least one first testing device and the at least one second testing device comprises a plurality of first terminals configured to be connected to the plurality of devices-under-test, wherein each first terminal of the plurality of first terminals is configured to be connected to a respective device-under-test of the plurality of devices-under-test.

* * * * *